(12) United States Patent
Hong et al.

(10) Patent No.: US 7,145,826 B2
(45) Date of Patent: Dec. 5, 2006

(54) DEVICE FOR CONTROLLING TEMPERATURE COMPENSATED SELF-REFRESH PERIOD

(75) Inventors: Yun Seok Hong, Gyeonggi-do (KR); Bong Seok Han, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 113 days.

(21) Appl. No.: 11/004,841

(22) Filed: Dec. 7, 2004

(65) Prior Publication Data

US 2006/0087901 A1    Apr. 27, 2006

(30) Foreign Application Priority Data

Oct. 21, 2004    (KR) ............... 10-2004-0084456

(51) Int. Cl.
*G11C 7/00* (2006.01)
(52) U.S. Cl. ............ 365/222; 365/189.06; 365/189.07; 365/193; 365/211
(58) Field of Classification Search ............... 365/222, 365/189.06, 189.07, 193, 211
See application file for complete search history.

(56) References Cited

U.S. PATENT DOCUMENTS 5,654,930 A *  8/1997  Yoo et al. .................. 365/222
6,868,026 B1 *  3/2005  Fujioka ...................... 365/222

* cited by examiner

*Primary Examiner*—Tuan T. Nguyen
*Assistant Examiner*—N Nguyen
(74) *Attorney, Agent, or Firm*—Heller Ehrman LLP

(57) ABSTRACT

A device for controlling a temperature compensated self-refresh period clamps a self-refresh signal at high temperature over a specific temperature to maintain the self-refresh period, thereby removing dependency on temperature. In the device, an oscillating signal having a period varied depending on temperature change is generated below a specific temperature, and a period of a first period signal is compared with that of the oscillating signal applied from a temperature compensated self-refresh circuit unit over the specific temperature. When the period of the oscillating signal is shorter than that of the first signal, a pulse width of an oscillating strobe signal generated in response to a plurality of division signals each obtained by dividing the period of the oscillating signal at a predetermined ratio is controlled, so that an oscillating period of the temperature compensated self-refresh circuit unit is kept at a fixed state.

9 Claims, 11 Drawing Sheets

DEVICE FOR CONTROLLING TEMPERATURE COMPENSATED SELF-REFRESH PERIOD

BACKGROUND ART

1. Field of the Invention

The present invention generally relates to a device for controlling a temperature compensated self-refresh period, and more specifically, to a technology which prevents mis-operations of a temperature compensated self-refresh circuit in a low power semiconductor memory device.

2. Description of the Prior Art

Generally, a self-refresh operation refers to an operation performed at every predetermined period (basic period) by a semiconductor memory device such as a DRAM (Dynamic Random Access Memory) in order to maintain data stored in a memory cell at a standby state.

However, unnecessary current is consumed since a refresh period is generated as it is when the self-refresh operation is performed at high temperature.

In order to reduce the unnecessary current, a temperature compensated self-refresh circuit that automatically regulates a self-refresh period depending on temperature change in a chip has been disclosed as shown in FIG. 1.

The conventional temperature compensated self-refresh circuit comprises a comparison unit 1, a reference voltage generating unit 2, a logic unit 3 and a temperature sensing unit 4.

Here, the comparison unit 1 comprises PMOS transistors P1 and P2, NMOS transistors N1~N3, and capacitors C1 and C2. A common gate of the PMOS transistors P1 and P2 is connected to a drain of the PMOS transistor P2, and a power voltage V is applied to a common source of the PMOS transistors P1 and P2.

The NMOS transistor N1, connected between the PMOS transistor P1 and the NMOS transistor N3, has a gate connected to a node (A). The NMOS transistor N2, connected between the PMOS transistor P2 and the NMOS transistor N3, has a gate connected to a node (B). The NMOS transistor N3, connected between the NMOS transistors N1, N2 and a ground voltage terminal, has a gate to receive a control signal VLR.

The capacitor C1 is connected between the node (A) and the ground voltage terminal, and the capacitor C2 is connected between the node (B) and the ground voltage terminal.

The reference voltage generating unit 2 comprises NMOS transistors N4 and N5 which are connected between a power voltage V terminal and the ground voltage terminal. The NMOS transistor N4, connected between the power voltage V terminal and the node (B), has a gate connected in common to a source. The NMOS transistor N5, connected between the node (B) and the ground voltage terminal, has a gate connected to the node (B).

The logic unit 3 comprises inverters IV1~IV4, and a NAND gate ND1. The inverters IV1~IV3 invert and delay an output signal from the comparison unit 1. The NAND gate ND1 performs a NAND operation on a temperature sensing operation signal TEMPON, an oscillating strobe signal TOSCRSTB and an output signal from the inverter IV3. The inverter IV4 inverts an output signal from the NAND gate ND1.

The temperature sensing unit 4 comprises PMOS transistors P3 and P4, NMOS transistors N6~N8, and an inverter IV5.

Here, the PMOS transistor P3, connected between the power voltage V terminal and a source of the NMOS transistor N6, has a gate to receive an output signal from the inverter IV4. The PMOS transistor P4, connected between the power voltage V terminal and the node (A), has a gate to receive the output signal from the inverter IV4.

The NMOS transistors N6~N8 are connected serially between the node (A) and the ground voltage terminal. Here, a gate of the NMOS transistor N6 is connected to the node (A), the NMOS transistor N7 has a drain connected in common to a gate, and a gate of the NMOS transistor N8 is connected to the output signal from the inverter IV4. The inverter IV5 inverts the output from the inverter IV4 to output an oscillating signal TEMPOSC.

Hereinafter, the operation of the above-described conventional temperature compensated self-refresh circuit is described.

When the temperature sensing operation signal TEMPON is applied, the node (A) transits from a power voltage level (1.5V) to a floating state. As a result, current applied to the node (A) comes to flow into the ground voltage terminal through the NMOS transistors N6 and N7 that are connected with a diode type.

Thereafter, the node (A) outputs the oscillating signal TEMPOSC at a high pulse when the node (A) is less than a voltage level (0.75V) of the node (B) which is a reference voltage of the comparison unit 1.

Here, when the temperature rises, threshold voltages of the NMOS transistors N6 and N7 which are connected with a two-stages diode structure become lower. As a result, as the current also rises, a voltage level of the node (A) reaches a level of the reference voltage of the comparison unit 1 much faster, so that the oscillating signal TEMPOSC is outputted at the high pulse. Therefore, as the temperature becomes higher, the period of the oscillating signal TEMPOSC becomes faster.

However, in the conventional temperature compensated self-refresh circuit, when the temperature becomes lower, the period of the oscillating signal TEMPOSC which is outputted from the circuit increases with an exponential type. As a result, if the temperature falls below a specific temperature, the oscillating signal TEMPOSC is no longer oscillated. In order to solve the problem, a device for controlling the oscillating strobe signal TOSCRSTB at low temperature to control the oscillating signal TEMPOSC at a predetermined period has been disclosed.

However, the period of the oscillating signal TEMPOSC is dramatically changed at high temperature of more than 100° C., so that a refresh period is not regularly generated. As a result, the self-refresh period varies, and consumption of current (IDD6) becomes larger to cause mis-operations of the self-refresh circuit.

SUMMARY OF THE INVENTION

Accordingly, it is an object of the present invention to clamp a self-refresh signal at high temperature over a specific temperature to maintain the self-refresh period, thereby reducing current consumption and preventing mis-operations.

In an embodiment, a device for controlling a temperature compensated self-refresh period comprises a temperature compensated self-refresh circuit unit, a division signal generating unit and a clamping unit. The temperature compensated self-refresh circuit unit generates an oscillating signal having a period varied depending on temperature change, and controls the period of the oscillating signal to a specific period corresponding to the oscillating strobe signal when an oscillating strobe signal is activated. The division signal generating unit compares a period of a first period signal with that of the oscillating signal to generate a plurality of division signals obtained by dividing the period of the oscillating signal at a predetermined ratio depending on the comparison result. The clamping unit compares the plurality of division signals with the first signal, and controls a pulse width of the oscillating strobe signal generated in response to corresponding one of the plurality of division signals when the period of the oscillating signal is shorter than that of the first period signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 2:
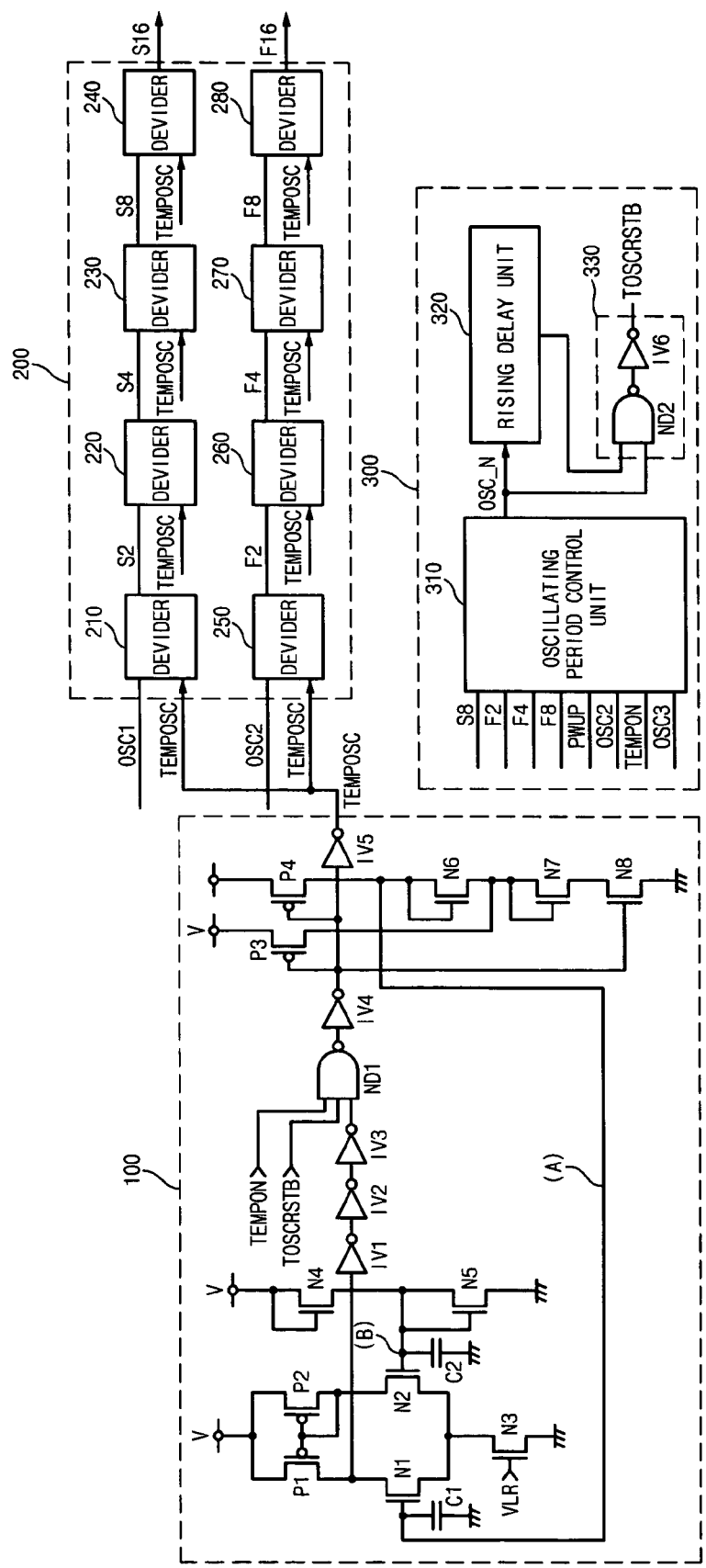
FIG. 2 is a diagram illustrating a device for controlling a temperature compensated self-refresh period according to an embodiment of the present invention.

FIG. 2 is a diagram illustrating a device for controlling a temperature compensated self-refresh period according to an embodiment of the present invention.

In an embodiment, the device for controlling a temperature compensated self-refresh period comprises a temperature compensated self-refresh (hereinafter, referred to as "TCSR") circuit unit 100, a division signal generating unit 200 and a clamping unit 300.

The TCSR circuit unit 100 outputs an oscillating signal TEMPOSC having a period varied depending on temperature change in response to an oscillating strobe signal TOSCRSTB and a temperature sensing operation signal TEMPON.

The TCSR circuit unit 100 regulates the period of the oscillating signal TEMPOSC by using a feature that current flowing in the NMOS transistors N6, N7 of the temperature sensing unit 4 which are connected in series with a diode type is varied depending on temperature change. That is, the comparison unit 1 compares an output signal from the reference voltage node (B) with a voltage varied depending on temperature change through the NMOS transistors N6 and N7, so that the oscillating signal TEMPOSC is generated with a variable period depending on the temperature change.

As a result, the TCSR circuit unit 100 maintains a fixed self-refresh period to cope with process skew and voltage change, and also maintains a stable current characteristic by changing the self-refresh period depending on the temperature change.

Figure 1:
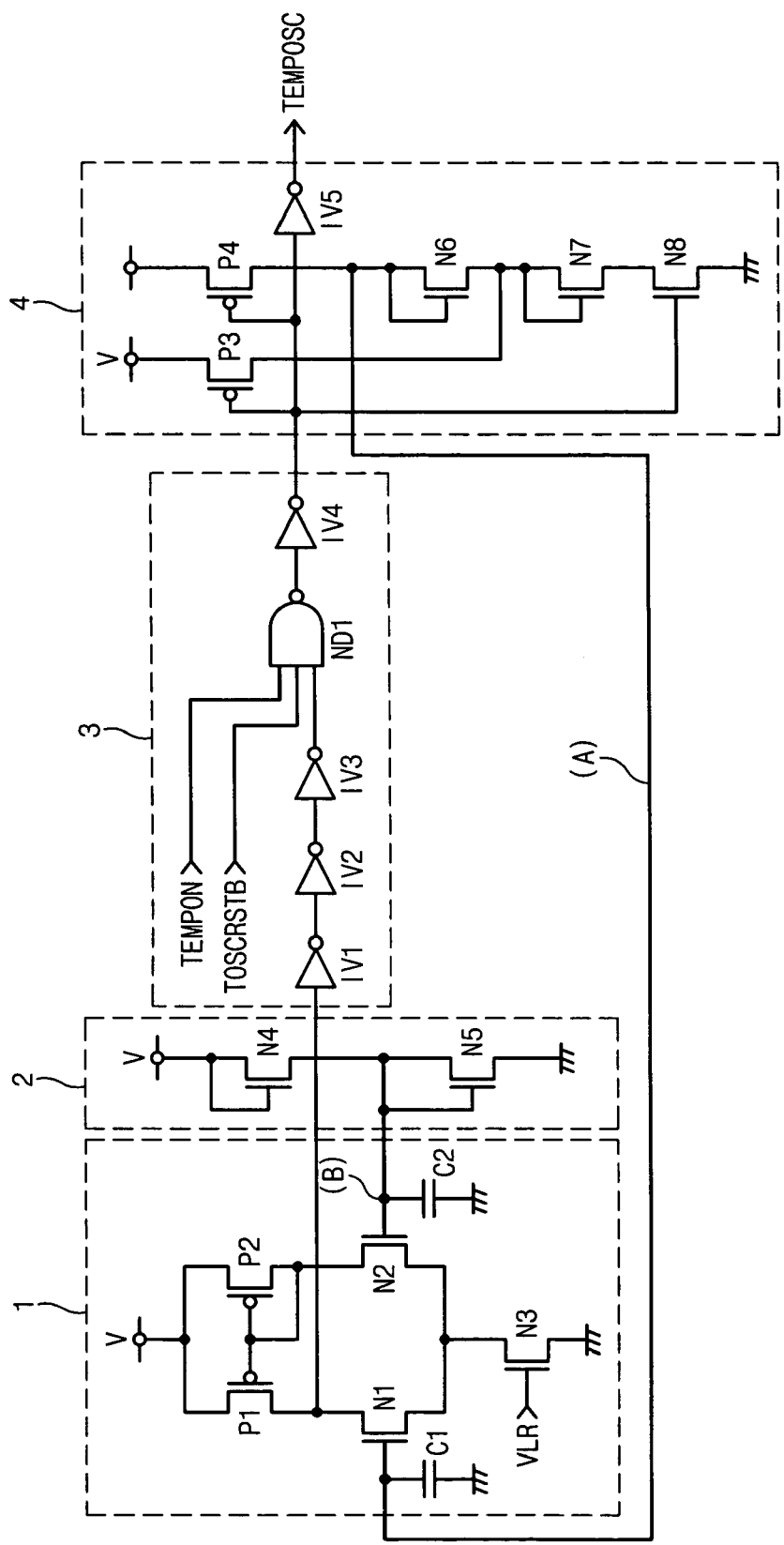
FIG. 1 is a circuit diagram illustrating a conventional temperature compensated self-refresh circuit.

Here, the detailed explanation on the TCSR circuit unit 100 is omitted because the basic structure of the TCSR circuit unit 100 is the same as that of FIG. 1.

The division signal generating unit 200 comprises a plurality of dividers 210~280.

The divider 210 compares a period signal OSC1 having a specific period (e.g., 6 µs) with the oscillating signal TEMPOSC applied from the TCSR circuit unit 100, and outputs a 2-division signal S2. The divider 220 compares the oscillating signal TEMPOSC with the 2-division signal S2, and outputs a 4-division signal S4. The divider 230 compares the oscillating signal TEMPOSC with the 4-division signal S4, and outputs a 8-division signal S8. The divider 240 compares the oscillating signal TEMPOSC with the 8-division signal S8, and outputs a 16-division signal S16.

The divider 250 compares a period signal OSC2 having a specific period (e.g., 1 µs) with the oscillating signal TEMPOSC applied from the TCSR circuit unit 100, and outputs a 2-division signal F2. The divider 260 compares the oscillating signal TEMPOSC with the 2-division signal F2, and outputs a 4-division signal F4. The divider 270 compares the oscillating signal TEMPOSC with the 4-division signal F4, and outputs a 8-division signal F8. The divider 280 compares the oscillating signal TEMPOSC with the 8-division signal F8, and outputs a 16-division signal F16.

Meanwhile, the clamping unit 300 comprises an oscillating period control unit 310, a rising delay unit 320 and a logic unit 330.

Here, the oscillating period control unit 310 generates an oscillating signal OSC_N in response to combination of the 8-division signal S8, the 2-division signal F2, the 4-division signal F4, the 8-division signal F8, the power-up signal PWUP, the period signal OSC2 and the temperature sensing operation signal TEMPON.

The rising delay unit 320 delays a rising edge of the oscillating signal OSC_N applied from the oscillating period control unit 310. The logic unit 330 which comprises a NAND gate ND2 and an inverter IV6 performs a NAND operation on an output signal from the rising delay unit 320 and the oscillating signal OSC_N, and outputs the oscillating strobe signal TOSCRSTB.

Then, the clamping unit 300 generates the oscillating strobe signal TOSCRSTB having a pulse width corresponding to a delay time of the rising delay unit 320 at a rising operation of the oscillating signal OSC_N. The oscillating strobe signal TOSCRSTB generated from the clamping unit 300 is feedback inputted to the NAND gate ND1 of the TCSR circuit unit 100.

Hereinafter, the detailed structure of the device for controlling a temperature compensated self-refresh period according to an embodiment of the present invention is described.

Figure 3:
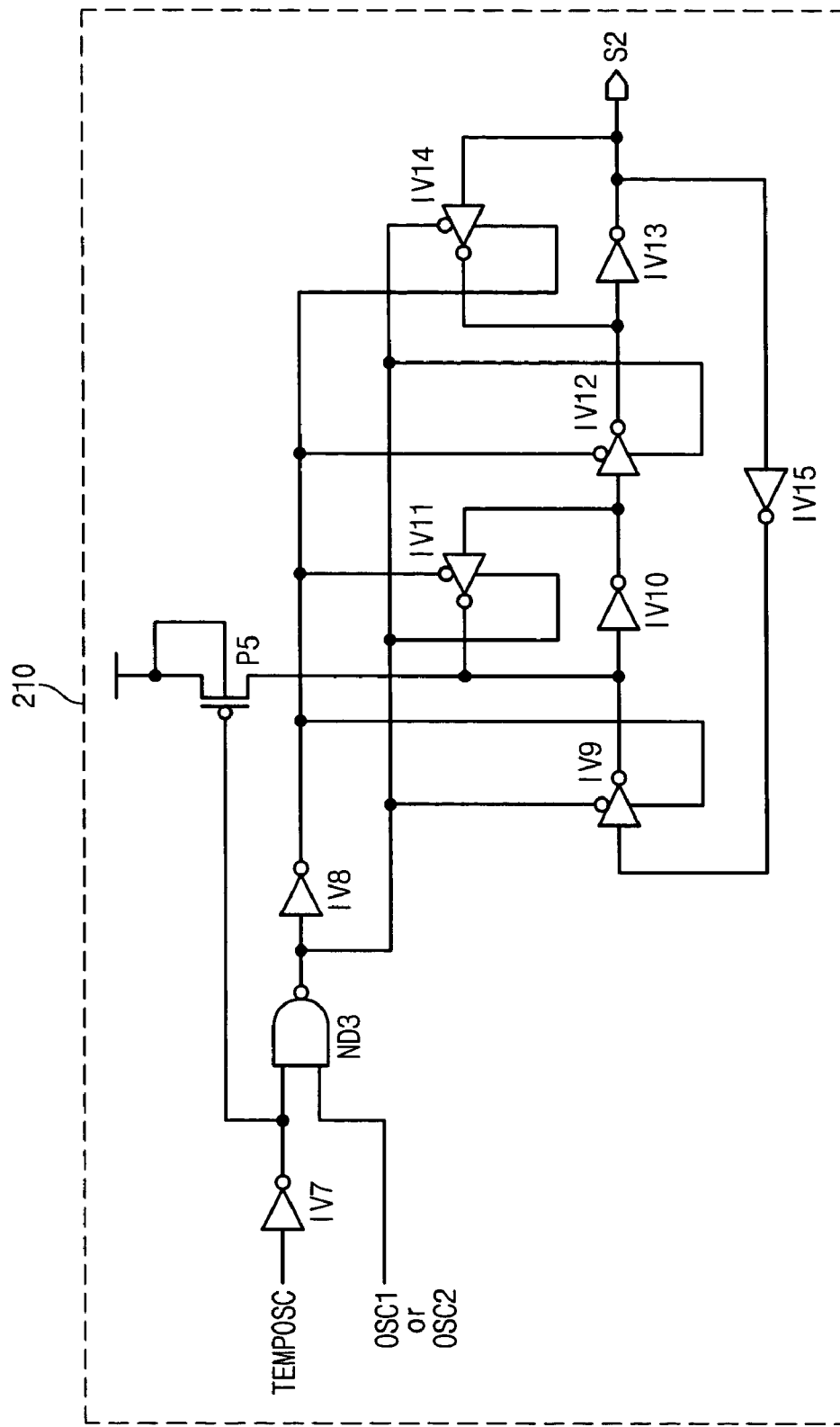
FIG. 3 is a circuit diagram illustrating a divider of FIG. 2.

FIG. 3 is a circuit diagram illustrating the divider 210 of FIG. 2. Here, the divider 210 is exemplified because the plurality of dividers 210~280 in the division signal generating unit 200 have the same configuration.

The divider 210 comprises a PMOS transistor P5, a NAND gate ND3 and inverters IV7~IV15. The divider 210 compares the period signal OSC1 (or period signal OSC2) with the oscillating signal TEMPOSC applied from the TCSR circuit unit 100, and outputs the 2-division signal S2.

Here, the divider 210 compares the period signal OSC1 with the oscillating signal TEMPOSC, and outputs the 2-division signal S2 at a high level which has a period twice longer than that of the period signal OSC1 when the period of the period signal OSC1 is shorter than that of the oscillating signal TEMPOSC. On the other hand, the divider 210 compares the period of the period signal OSC1 with that of the oscillating signal TEMPOSC, and outputs the 2-division signal S2 at a low level which has a period twice longer than that of the period signal OSC1 when the period of the period signal OSC1 is longer than that of the oscillating signal TEMPOSC.

Figure 4:
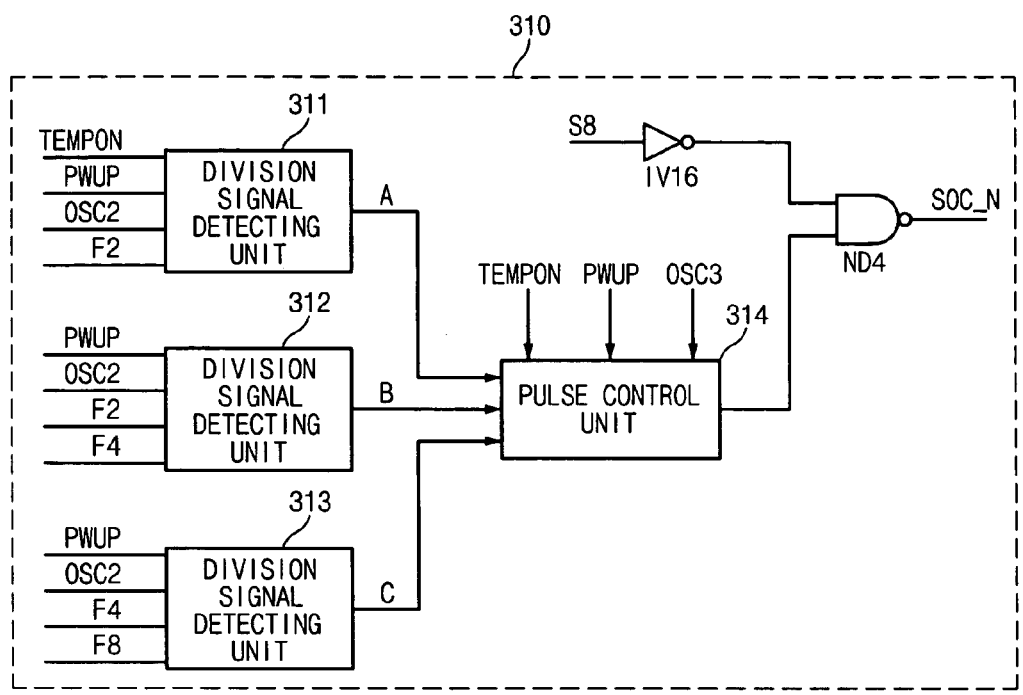
FIG. 4 is a diagram illustrating an oscillating period control unit FIG. 2.

FIG. 4 is a diagram illustrating the oscillating period control unit 310 FIG. 2.

The oscillating period control unit 310 comprises division signal detecting units 311~313, a pulse control unit 314, an inverter IV16 and a NAND gate ND4.

Here, the division signal detecting unit 311 outputs a control signal A in response to the temperature sensing operation signal TEMPON, the power-up signal PWUP, the period signal OSC2 and the 2-division signal F2 applied from the division signal generating unit 200. That is, the division signal detecting unit 311 compares the period signal OSC2 with the 2-division signal F2 when the temperature sensing operation signal TEMPON is activated, and outputs the control signal A depending on the comparison result.

The division signal detecting unit 312 compares the 4-division signal F4 with the 2-division signal F2 applied from the division signal generating unit 200 in response to the period signal OSC2 and the power-up signal PWUP, and outputs a control signal B.

The division signal detecting unit 313 compares the 8-division signal F8 with the 4-division signal F4 applied from the division signal generating unit 200 in response to the power-up signal PWUP and the period signal OSC2, and outputs a control signal C.

The pulse control unit 314 outputs a pulse signal to change the period of the oscillating signal TEMPOSC in response to the temperature sensing operation signal TEMPON, the power-up signal PWUP, an period signal OSC3 having a specific period (e.g., 4 μs) and control signals A, B, C. The inverter IV16 inverts the 8-division signal S8. The NAND gate ND4 performs a NAND operation on an output signal from the inverter IV16 and an output pulse signal of the pulse control unit 314, and outputs oscillating signal OSC_N.

Figure 5:
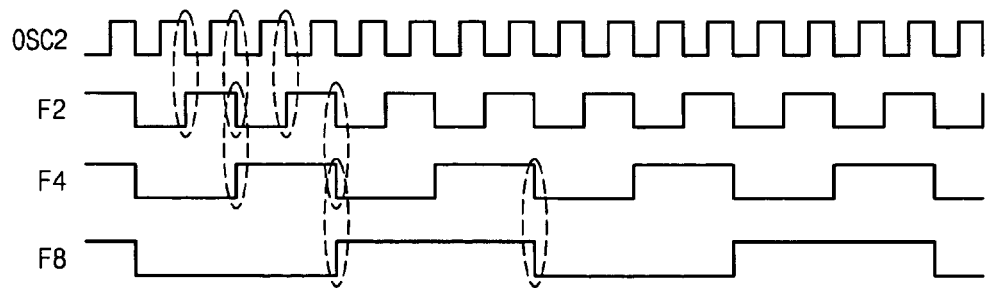
FIG. 5 is a diagram illustrating each pulse waveform of division signals inputted to a division signal detecting unit FIG. 4.

FIG. 5 is a diagram illustrating each pulse waveform of division signals inputted to the division signal detecting unit 311 FIG. 4.

Referring to FIG. 5, the 2-division signal F2 inputted to the division signal detecting unit 311 has a pulse type obtained by 2-dividing the period signal OSC2 having a specific period (e.g., 6 μs). The 4-division signal F4 has a pulse type obtained by 4-dividing the period signal OSC2, and the 8-division signal F8 has a pulse type obtained by 8-dividing the period signal OSC2.

Figure 6:
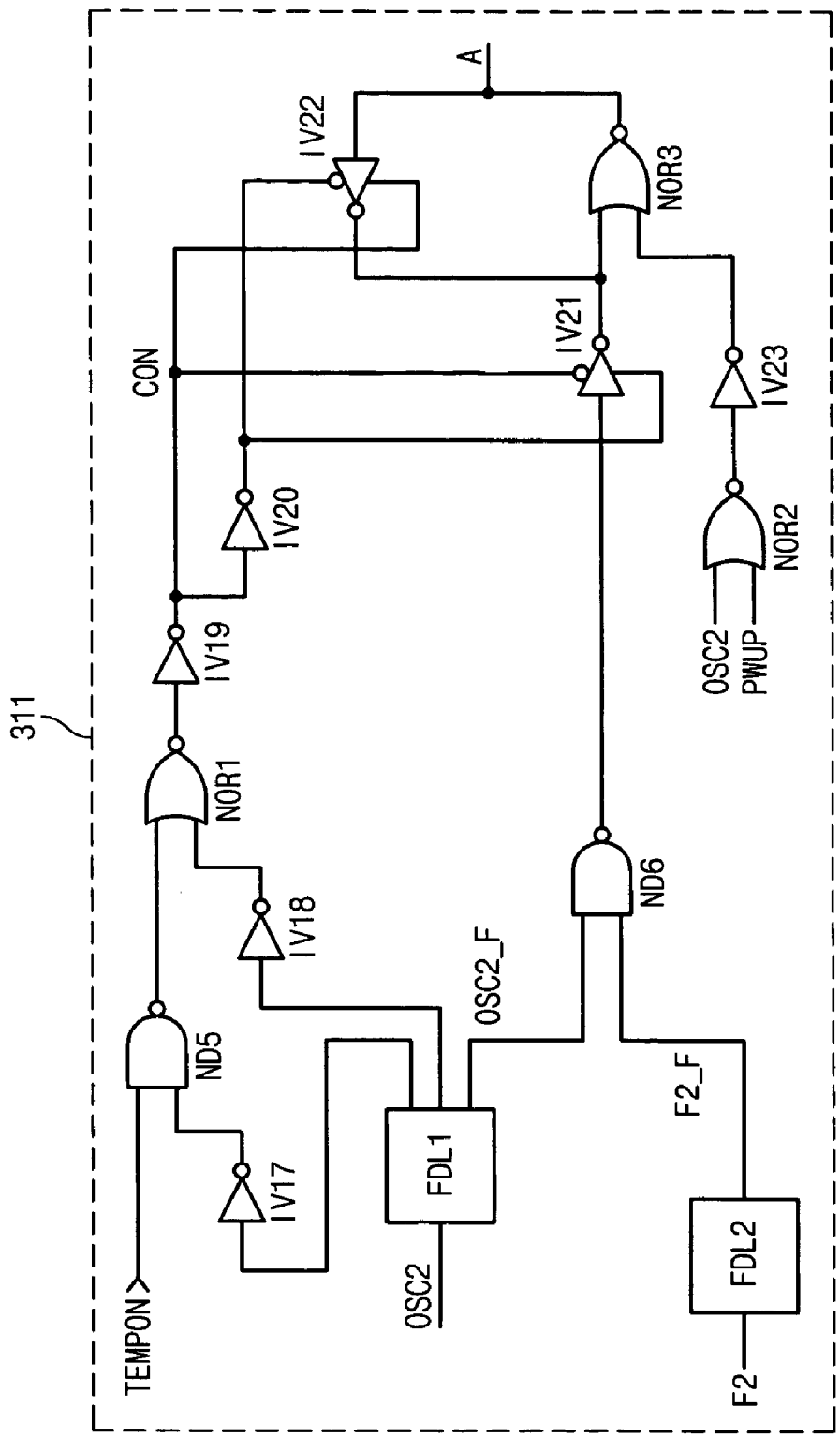
FIG. 6 is a circuit diagram illustrating the division signal detecting unit FIG. 4.

FIG. 6 is a circuit diagram illustrating the division signal detecting unit 311 FIG. 4.

The division signal detecting unit 311 comprises falling delay logic units FDL1 and FDL2, inverters IV17~IV23, NAND gates ND5 and ND6, and NOR gates NOR1~NOR3.

Figure 7:
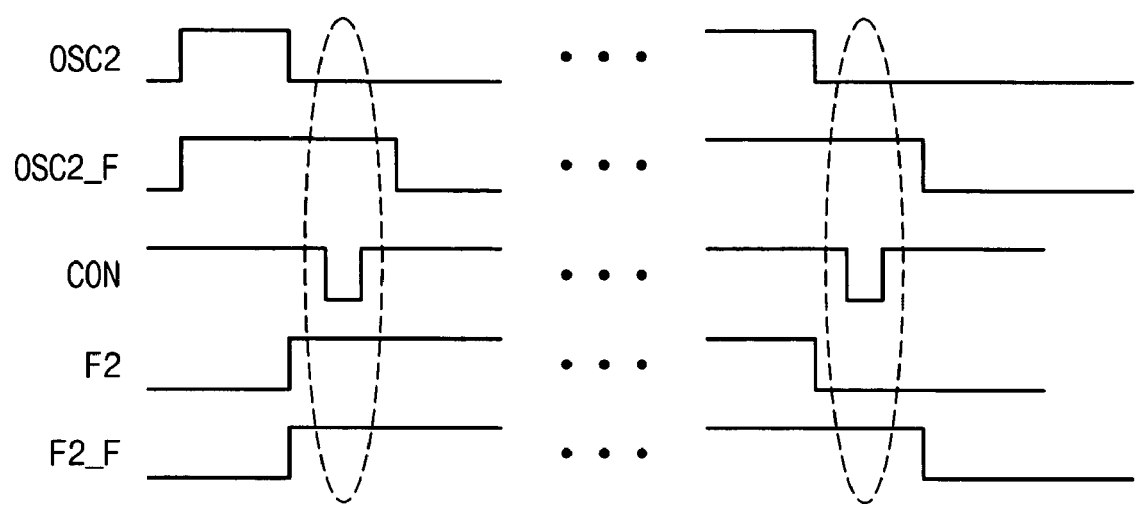
FIG. 7 is a voltage waveform diagram of each signal to the division signal detecting unit FIG. 4.

The above-described division signal detecting unit 311 as shown in FIG. 7 determines transition of the 2-division signal F2 to a high level when the period signal OSC2 transits from 'high' to 'low'.

In the division signal detecting unit 311, a period signal OSC2_F is generated by the falling delay logic unit FDL when the period signal OSC2 becomes 'low'. After a random delay time when the period signal OSC2 becomes 'low' passes, a control signal CON to operate the inverter IV21 for a specific time is outputted. That is, if the period signal OSC2_F becomes 'high' when the period signal OSC2 is 'low', the control signal CON with a short pulse type is generated.

Here, when a division signal F2_F outputted from the falling delay logic unit FDL2 and the period signal OSC2_F become all 'high' in a period where the control signal CON transits from 'high' to 'low', the division signal detecting unit 311 determines that the period of the oscillating signal TEMPOSC is faster than that of the 2-division signal F2. As a result, the division signal detecting unit 311 controls the control signal A to maintain its initial value at the low level.

On the other hand, the division signal detecting unit 311 outputs the control signal A at a high level if the 2-division signal F2 is 'low' when the period signal OSC2 transits from 'high' to 'low'.

Figure 8:
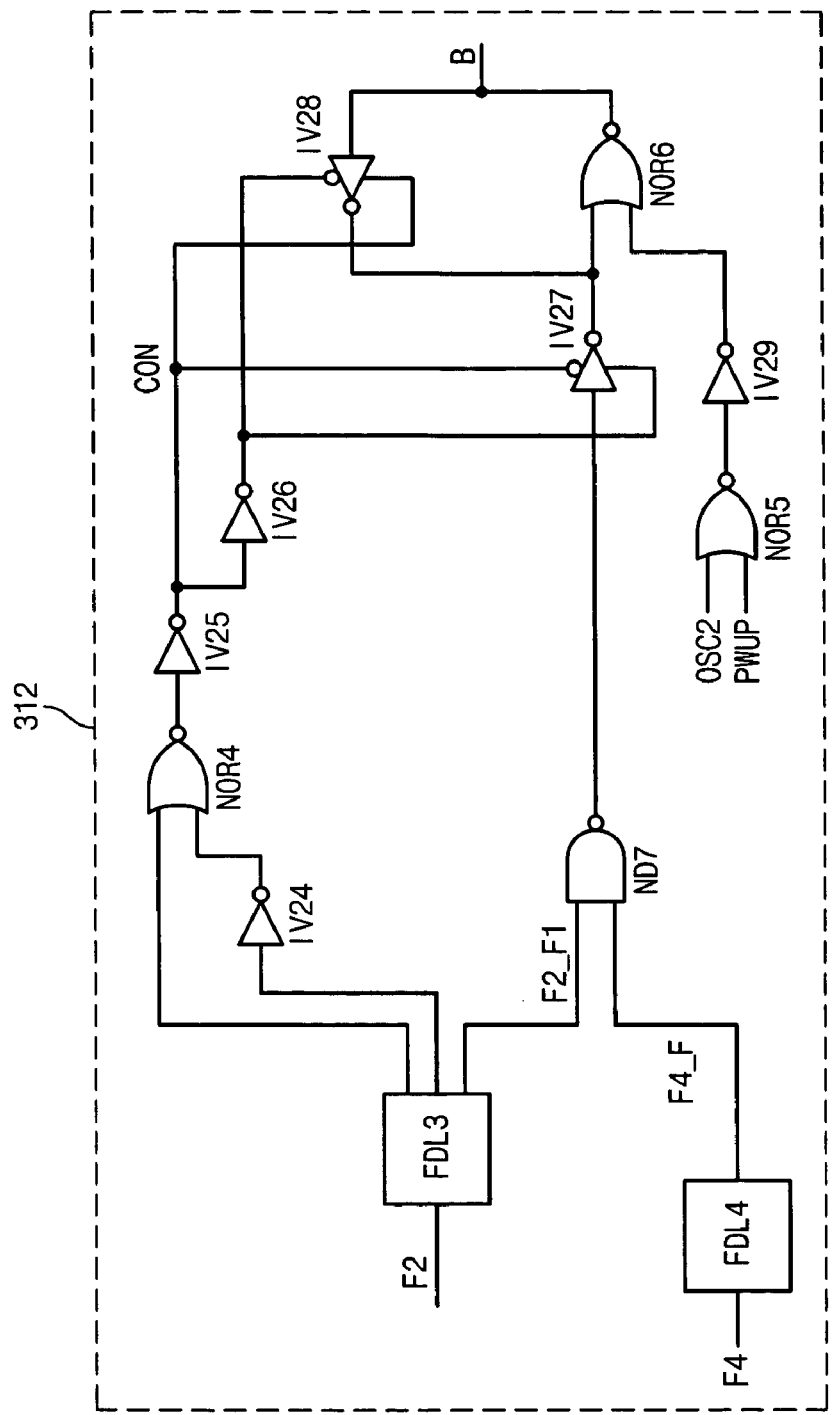
FIGS. 8 and 9 are circuit diagrams illustrating the division signal detecting unit of FIG. 4.

FIG. 8 is a circuit diagram illustrating the division signal detecting unit 312 of FIG. 4.

The division signal detecting unit 312 comprises falling delay logic units FDL3 and FDL4, inverters IV24~IV29, a NAND gate ND7, and NOR gates NOR4~NOR6.

The above-described division signal detecting unit 312 is not operated when the 2-division signal F2 is 'low' or 'high'. On the other hand, the division signal detecting unit 312 is operated only when the period of the 4-division signal F4 is not changed to 'high' in a period where the 2-division signal F2 transits from 'high' to 'low'. As a result, the division signal detecting unit 312 compares the period of the oscillating signal TEMPOSC with that of the 4-division signal F4 to determine a voltage level of the control signal B.

Figure 9:
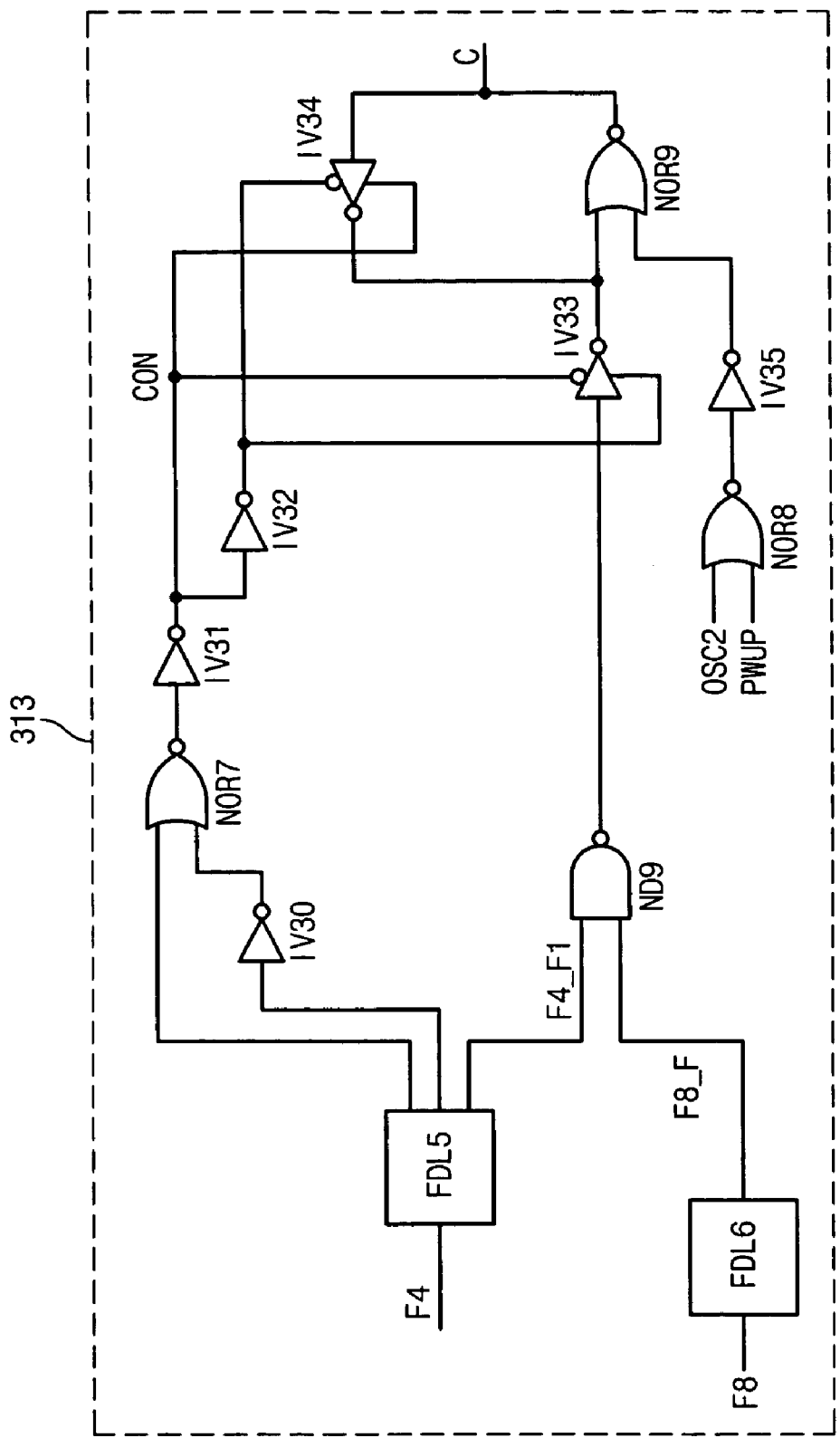

FIG. 9 is a circuit diagram illustrating the division signal detecting unit 313 of FIG. 4.

The division signal detecting unit 313 comprises falling delay logic units FDL5 and FDL6, inverters IV30~IV35, a NAND gate ND9, and NOR gates NOR7~NOR9.

The above-described division signal detecting unit 313 is not operated when the 4-division signal F4 is 'low' or 'high'. On the other hand, the division signal detecting unit 313 is operated only when the period of the 8-division signal F8 is not changed to 'high' in a period where the 4-division signal F4 transits from 'high' to 'low'. As a result, the division signal detecting unit 313 compares the period of the oscillating signal TEMPOSC with that of the 8-division signal F8 to determine a voltage level of the control signal C.

Figure 10:
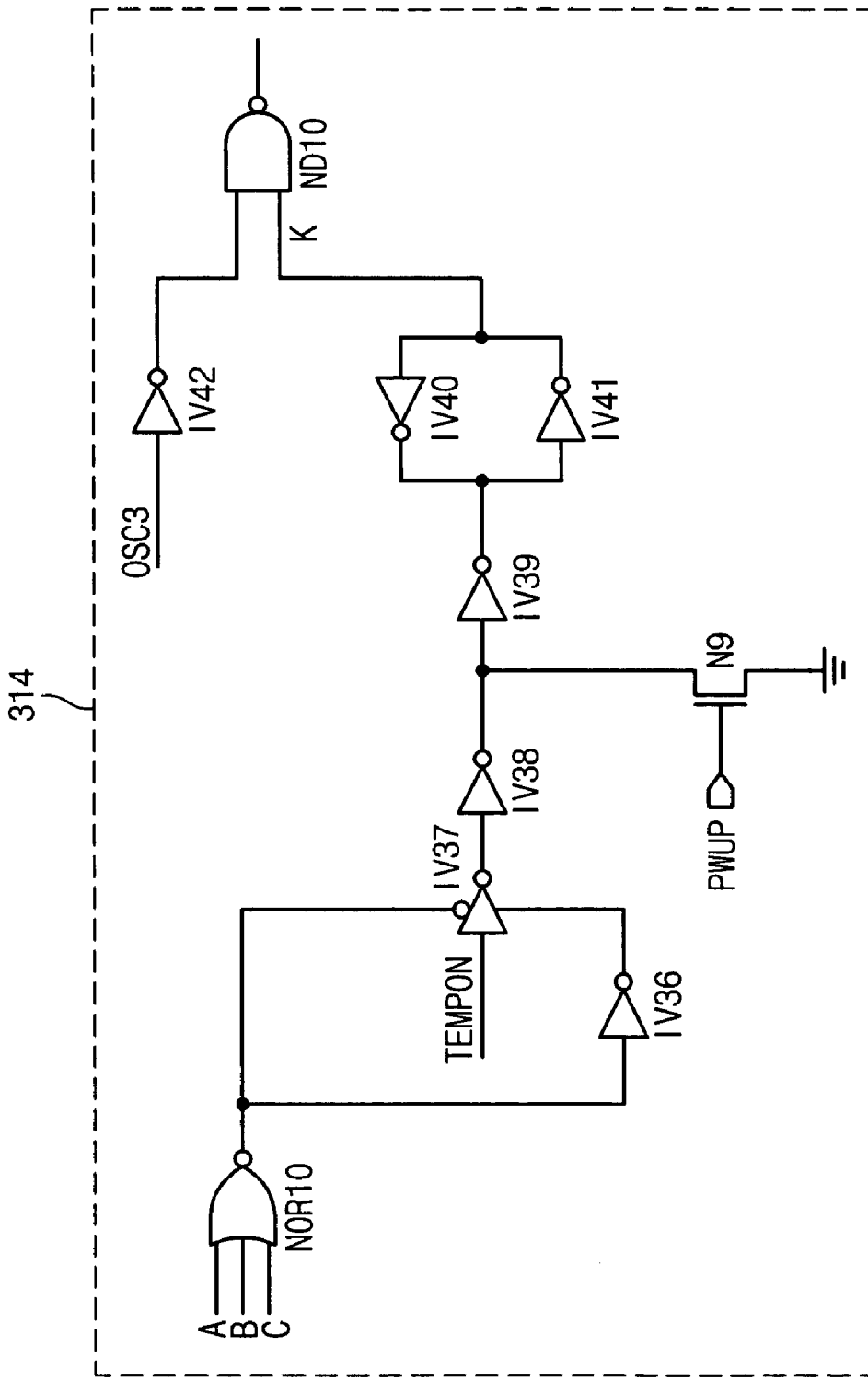
FIG. 10 is a circuit diagram illustrating a pulse control unit of FIG. 4.

FIG. 10 is a circuit diagram illustrating the pulse control unit 314 of FIG. 4.

The pulse control unit 314 comprises a NOR gate NOR10, inverters IV36~IV42, a NMOS transistor N9, and a NAND gate ND10.

Here, the NOR gate NOR10 performs a NOR operation on the control signals A, B and C, respectively. The inverters IV37 and IV38 delay the temperature sensing operation signal TEMPON. The latch-structured inverters IV40 and IV41 latch an output signal from the inverter IV39 to output a control signal K. Here, the control signal K is kept 'low' when the control signal A is 'low'. The NAND gate ND10 performs a NAND operation on the control signal K and the period signal OSC3 (e.g., 4 μs) inverted by the inverter IV42.

Figure 11:
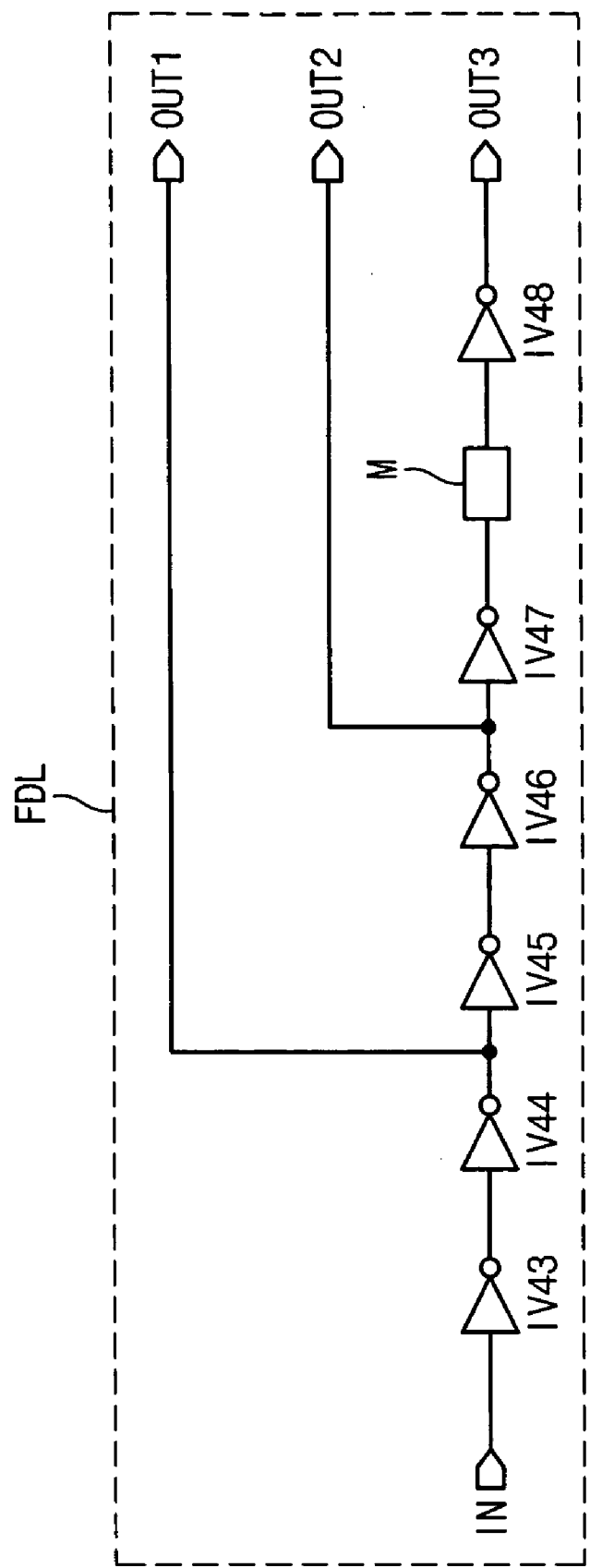
FIG. 11 is a circuit diagram illustrating a falling delay logic unit of FIGS. 6 to 9.

FIG. 11 is a circuit diagram illustrating the falling delay logic unit FDL of FIGS. 6 to 9.

The falling delay logic unit FDL has an inverter chain structure including a plurality of inverters IV43~IV48 connected serially. Here, an output signal OUT1 from the inverters IV43 and IV44 has a short delay time, and an output signal OUT3 from the inverters IV43~IV48 has a long delay time. The falling delay logic unit FDL is configured to regulate the delay time depending on selective connection of a metal option M.

Figure 12:
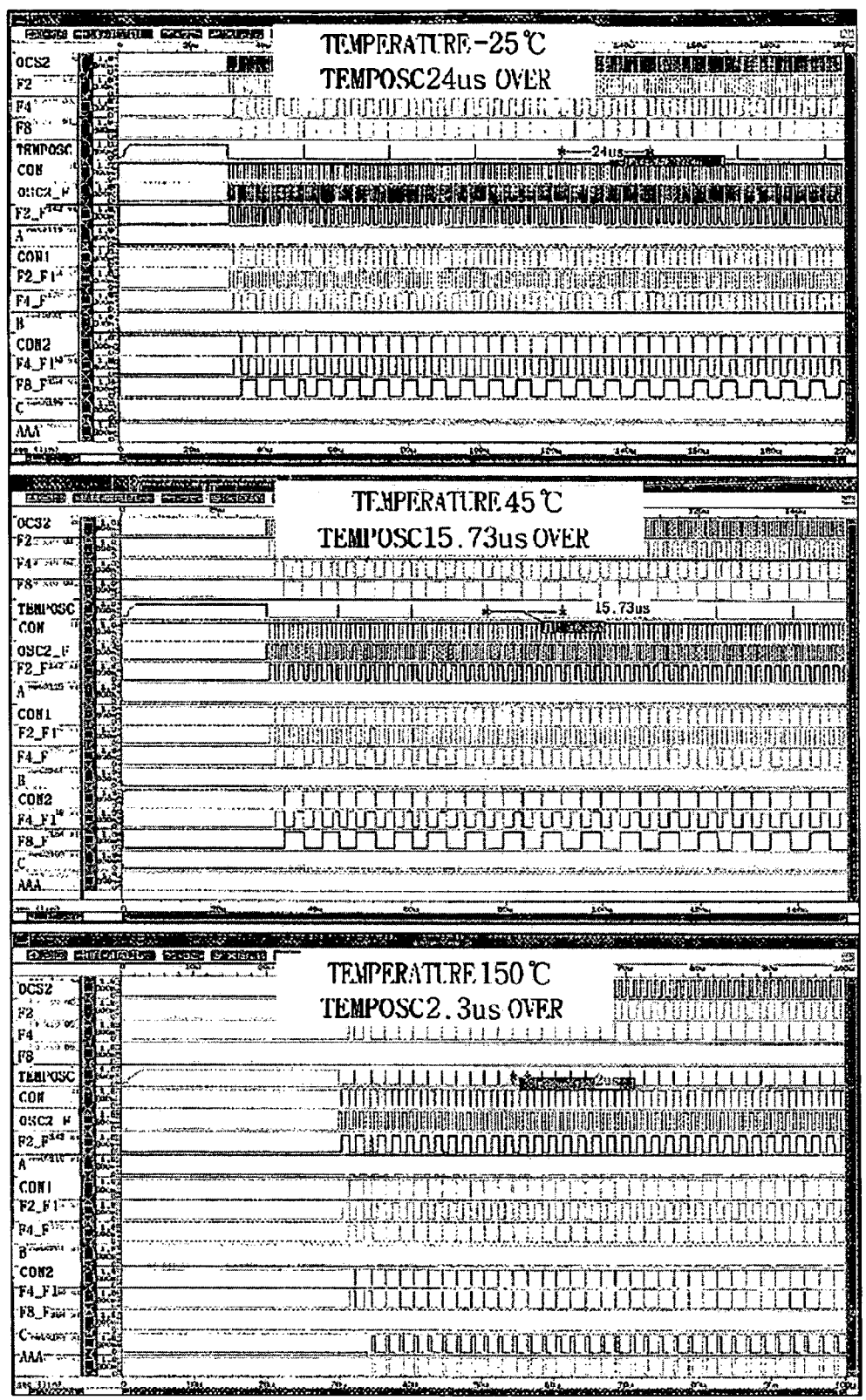
FIG. 12 is a simulation diagram illustrating the device for controlling a temperature compensated self-refresh period according to an embodiment of the present invention.

FIG. 12 is a simulation diagram illustrating the device for controlling a temperature compensated self-refresh period according to an embodiment of the present invention.

As shown in FIG. 12, when the period of the oscillating signal TEMPOSC is over 24 μs at −25° C., the refresh period is maintained at 24 μs. When the period of the oscillating signal TEMPOSC is over 15.73 μs at 45° C., the refresh period is outputted at the period of the oscillating signal TEMPOSC. When the period of the oscillating signal TEMPOSC is over 2.3 μs at a specific temperature (e.g., 150° C.), the self-refresh period is constantly maintained at 2 μs.

Hereinafter, the operation of the device for controlling a temperature compensated self-refresh period according to an embodiment of the present invention is described.

The TCSR circuit unit 100 outputs the oscillating signal TEMPOSC having a period varied depending on temperature change when the oscillating strobe signal TOSCRSTB and the temperature sensing operation signal TEMPON are activated.

Thereafter, the divider 210 compares the period of the oscillating signal TEMPOSC with the period signal OSC1 having a specific period (e.g., 6 μs) which is applied externally, and outputs a signal having a period twice longer than that of the 2-division signal S2 when the period of the oscillating signal TEMPOSC is longer than that of the period signal OSC1. On the other hand, the divider 210 outputs the 2-division signal S2 at the low level when the period of the oscillating signal TEMPOSC is shorter than that of the period signal OSC1.

Then, the divider 220 compares the 2-division signal S2 with the period of the oscillating signal TEMPOSC, and outputs the 4-division signal S4 having a period four times longer than that of the 2-division signal S2 (twice longer than that of the period signal OSC1) when the period of the oscillating signal TEMPOSC is longer than that of the 2-division signal S2. On the other hand, the divider 220 outputs the 4-division signal S4 at the low level when the period of the oscillating signal TEMPOSC is shorter than that of the 2-division signal S2.

For example, when the period of the oscillating signal TEMPOSC is 30 μs at low temperature, the 2-division signal S2 becomes 12 μs and the 4-division signal S4 becomes 24 μs. The 8-division signal S8 is reset after tens of ns from a rising transition point, and the 16-division signal S16 becomes 'low'. Here, the 2-division signal F2 becomes 2 μs, the 4-division signal F4 becomes 4 μs, the 8-division signal F8 becomes 16 μs, and the 16-division signal F16 is reset when the period of the oscillating signal TEMPOSC becomes 30 μs.

In the division signal generating unit 200, the 8-division signal S8 is inputted at the high level to the oscillating period control unit 310 when the period of the oscillating signal TEMPOSC is larger than that of the 8-division signal S8 at low temperature. The rising delay unit 320 of the oscillating period control unit 310 outputs the oscillating strobe signal TOSCRSTB at a low level which has a pulse width corresponding to a predetermined delay time at the rising edge of the oscillating signal OSC_N.

Thereafter, the TCSR circuit unit 100 outputs a period of 24 μs which is a half period of the 8-division signal when the oscillating strobe signal TOSCRSTB becomes 'low' to reset the oscillating signal TEMPOSC.

On the other hand, when the period of the oscillating signal TEMPOSC is 3 μs at high temperature, the 2-division signal S2, the 4-division signal S4, the 8-division signal S8 and the 16-division signal S16 become 'low'. The 2-division signal F2 becomes 2 μs, the 4-division signal F4 is reset after tens of ns from the rising transition point, and the 8-division signal F8 and the 16-division signal F16 become 'low'.

The clamping unit 300 compares a specific period (e.g., 4 μs) with the period of the oscillating signal TEMPOSC varied depending on temperature, and outputs the period signal OSC2 (e.g., 1 μs) when the period of the oscillating signal TEMPOSC is shorter than the specific period (e.g., 4 μs). Also, the clamping unit 300 outputs specific period signal which is differentiated depending on the period of the oscillating signal TEMPOSC when the period of the oscillating signal TEMPOSC is larger than a specific period (e.g., 24 μs).

For example, the clamping unit 300 outputs a period signal having a period of 24 μs when the period of the oscillating signal TEMPOSC is over 24 μs. When the period of the oscillating signal TEMPOSC ranges 4 μs to 24 μs, the period of the oscillating signal TEMPOSC is kept as it is. When the period of the oscillating signal TEMPOSC is below 4 μs, a period signal having a period of 2 μs is outputted.

For the above-described operation, each division signal detecting unit 311~313 of the oscillating period control unit 310 sets initial values of the control signals A, B and C at a low level in response to the power-up signal PWUP.

The 2-division signal F2 is not outputted by the pulse control unit 314 before the period of the initial oscillating signal TEMPOSC is compared with the 2-division signal F2, the 4-division signal F4 and the 8-division signal F8. When the power-up signal PWUP is activated to turn on the NMOS transistor N9, the inverter IV39 outputs a high level signal, and the control signal K is set at a low level by the latch-structured inverters IV40 and IV41.

For example, the division signal detecting unit 311 keeps the control signal A at a low level when the period of the oscillating signal TEMPOSC is 3 μs.

When the period signal OSC2 becomes 'low', the division signal detecting unit 311 determines whether the 2-division signal F2 is changed to a high level. Here, the period signal OSC2_F is generated by the falling delay logic unit FDL when the period signal OSC2 becomes 'low'. Then the control signal CON for operating the inverter IV21 for a predetermined time after a random delay time when the period signal OSC2 becomes 'low'.

Here, the division signal detecting unit 311 judges that the period of the oscillating signal TEMPOSC is faster than that of the 2-division signal F2 when the period signal OSC2_F and the division signal F2_F outputted from the falling delay logic unit FDL2 become all 'high' in a period where the control signal CON is 'low'. As a result, the division signal detecting unit 311 controls the control signal A at the low state which is its initial value. The pulse control unit 314 keeps the control signal K at the low level continuously.

Thereafter, when the period of the oscillating signal TEMPOSC is 3 μs, a rising signal of the 4-division signal F4 is generated, so that the control signal B of the division signal detecting unit 312 becomes 'low'. A falling signal of the 4-division signal F4 is generated when the period of the oscillating signal TEMPOSC becomes 3 μs. Then, the division signal detecting unit 313 compares the 4-division signal F4 with the 8-division signal F8 at the low level, and outputs the control signal C at a high level.

Next, the clamping unit 300 outputs the oscillating strobe signal TOSCRSTB to correspond to the 2-division signal F2. As a result, the period of the oscillating signal TEMPOSC is 2 μs by the TCSR circuit unit 100.

Meanwhile, the period of the oscillating signal TEMPOSC is 10 μs, all of the 2-division signal, the 4-division signal and the 8-division signal F8 are all generated. As a result, the control signals A, B and C of the division signal detecting unit 311~313 constantly become 'low', so that the period of the oscillating signal TEMPOSC is varied depending on temperature change.

When the period of the oscillating signal TEMPOSC is 40 μs, the 2-division signal, the 4-division signal and the 8-division signal F8 are all generated. As a result, the control signals A, B and C of the division signal detecting unit 311~313 constantly become 'low', so that the period of the oscillating signal TEMPOSC is varied depending on temperature change. However, the period of the oscillating signal TEMPOSC is outputted at 24 μs by the period signal OSC3 (e.g., 4 μs) of the pulse control unit 314.

As discussed earlier, in an embodiment of the present invention, a device for controlling a temperature compensated self-refresh period clamps a self-refresh signal at high temperature over a specific temperature to maintain the self-refresh period, thereby preventing mis-operations and improving an operation margin.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A device for controlling a temperature compensated self-refresh period, comprising:
    a temperature compensated self-refresh circuit unit for generating an oscillating signal having a period varied depending on temperature change, and controlling the period of the oscillating signal to a specific period corresponding to the oscillating strobe signal, when an oscillating strobe signal is activated;
    a division signal generating unit for comparing a period of a first period signal with that of the oscillating signal to generate a plurality of division signals obtained by dividing the period of the oscillating signal at a predetermined ratio depending on the comparison result; and
    a clamping unit for comparing the plurality of division signals with the first signal, and controlling a pulse width of the oscillating strobe signal generated in response to corresponding one of the plurality of division signals, when the period of the oscillating signal is shorter than that of the first period signal.

2. The device according to claim 1, wherein the division signal generating unit comprises:
    a plurality of first dividers each for comparing the period of the oscillating signal with the first period signal and dividing the period of the oscillating signal depending on the comparison result to generate the plurality of division signals; and
    a plurality of second dividers each for comparing the period of the oscillating signal with a second period signal whose period is longer than that of the first period signal and dividing the period of the oscillating signal to generating the plurality of division signals.

3. The device according to claim 1, wherein the division signal generating unit compares the oscillating signal with the first period signal to divide the period of the oscillating signal when the period of the oscillating signal is longer than that of the first signal and to output a low signal when the period of the oscillating signal is shorter than that of the first period signal.

4. The device according to claim 1, wherein the clamping unit comprises:
    an oscillating period control unit for outputting a first oscillating signal corresponding to states of the plurality of division signals in response to the first period signal, a power-up signal and a temperature sensing operation signal;
    a rising delay unit for detecting a rising edge of the first oscillating signal to delaying the rising edge for a predetermined time; and
    a logic unit for outputting the oscillating strobe signal having a pulse width corresponding to the predetermined time in response to the first oscillating signal and an output signal from the rising delay unit.

5. The device according to claim 4, wherein the oscillating period control unit comprises:
    a first division signal detecting unit for detecting transition of the first division signal when the first period signal transits to 'low' in response to the temperature sensing operation signal to output a first control signal;
    a second division signal detecting unit for comparing the first division signal with a second division signal when the first division signal transits from 'high' to 'low' to output a second control signal;
    a third division signal detecting unit for comparing the second division signal with a third division signal when the second division signal transits from 'high' to 'low' to output a third division signal; and
    a pulse control unit for controlling output of a third period signal having a larger period than that of the first period signal depending on states of the first control signal, the second control signal and the third control signal in response to the temperature sensing operation signal.

6. The device according to claim 5, wherein the first division signal detecting unit comprises:
    a first power-up control means for controlling the first control signal at a low state when the power-up signal is activated;
    a first falling delay logic unit for detecting a falling edge of the first period signal and delaying the falling edge for a predetermined time;
    a second falling delay logic unit for detecting a falling edge of the first division signal and delaying the falling edge for a predetermined time; and
    a first logic means for combining output signals from the first falling delay logic unit and the second falling delay logic unit to control a level of the first control signal.

7. The device according to claim 5, wherein the second division signal detecting unit comprises:
    a second power-up control means for controlling the second control signal at a low state when the power-up signal is activated;

a third falling delay logic unit for detecting a falling edge of the first division signal to delay the falling edge for a predetermined time;

a fourth falling delay logic unit for detecting a falling edge of the second division signal to delay the falling edge for a predetermined time; and a second logic means for combining output signals from the third falling delay logic unit and the fourth falling delay logic unit to control a level of the second control signal.

8. The device according to claim 5, wherein the third division signal detecting unit comprises:

a third power-up control means for controlling the third control signal at a low level when the power-up signal is activated;

a fifth falling delay logic unit for detecting a falling edge of the second division signal to delay the falling edge for a predetermined time;

a sixth falling delay logic unit for detecting a falling edge of the third division signal to delay the falling edge for a predetermined time; and a third logic means for combining output signals from the fifth falling delay logic unit and the sixth falling delay logic unit to control a level of the third control signal.

9. The device according to claim 5, wherein the pulse control unit outputs the third period signal when at least one of the first control signal, the second control signal and the third control signal is over a predetermined level.

* * * * *